(12) United States Patent
Sun et al.

(10) Patent No.: US 12,339,178 B2
(45) Date of Patent: Jun. 24, 2025

(54) MECHANISM FOR ASSEMBLING FORCE SENSOR PATCH INTO EARPHONE DEVICE

(71) Applicant: PixArt Imaging Inc., Hsin-Chu (TW)

(72) Inventors: Chih-Ming Sun, Hsin-Chu (TW); Yen-Po Chen, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 694 days.

(21) Appl. No.: 17/680,232

(22) Filed: Feb. 24, 2022

(65) Prior Publication Data

US 2022/0307925 A1 Sep. 29, 2022

Related U.S. Application Data

(63) Continuation-in-part of application No. 17/235,664, filed on Apr. 20, 2021, now Pat. No. 11,761,830, which is a continuation-in-part of application No. 17/130,103, filed on Dec. 22, 2020, now Pat. No. 11,733,109, which is a continuation of application No. 16/247,573, filed on Jan. 15, 2019, now Pat. No. 10,921,199.

(60) Provisional application No. 63/165,736, filed on Mar. 24, 2021.

(51) Int. Cl.
*G01L 1/14* (2006.01)
*H05K 1/03* (2006.01)
*H05K 1/11* (2006.01)
*H05K 1/18* (2006.01)
*H05K 3/32* (2006.01)

(52) U.S. Cl.
CPC ............ *G01L 1/144* (2013.01); *H05K 1/0393* (2013.01); *H05K 1/118* (2013.01); *H05K 2201/10151* (2013.01)

(58) Field of Classification Search
CPC ...... G01L 1/144; H05K 1/0393; H05K 1/118; H05K 2201/10151; H05K 1/189; H05K 3/323
See application file for complete search history.

(56) References Cited

U.S. PATENT DOCUMENTS

2017/0350771 A1* 12/2017 Chern .................. G01L 1/18
2020/0100013 A1* 3/2020 Harjee ................. H04R 1/1041
2021/0219042 A1* 7/2021 Harjee ................. H03K 17/975

FOREIGN PATENT DOCUMENTS

| CN | 112272344 A | 1/2021 | |
| CN | 112492435 A | 3/2021 | |
| CN | 212721863 U | 3/2021 | |
| WO | WO-2014155326 A2 * | 10/2014 | ............. G01L 1/142 |

* cited by examiner

*Primary Examiner* — Eric S. McCall
*Assistant Examiner* — Anthony W Megna Fuentes
(74) *Attorney, Agent, or Firm* — Winston Hsu

(57) ABSTRACT

An earphone device includes a housing subassembly, an inner casing subassembly, an audio processor, and a force sensor patch. The inner casing subassembly is disposed in the housing subassembly and integrated with a printed circuit board having specific electrode(s). The audio processor is disposed on the printed circuit board. The force sensor patch is pasted onto specific electrode(s) of the printed circuit board to be coupled to the audio processor through specific electrode(s). The force sensor patch is disposed between a part of the housing subassembly and a part of the inner casing subassembly and arranged to detect a user's pressure applied onto the part of the housing subassembly.

5 Claims, 14 Drawing Sheets

MECHANISM FOR ASSEMBLING FORCE SENSOR PATCH INTO EARPHONE DEVICE

CROSS REFERENCE TO RELATED APPLICATIONS

This application claims the benefit of U.S. Provisional Application No. 63/165,736, filed on Mar. 24, 2021. Further, this application is a continuation-in-part of U.S. application Ser. No. 17/235,664, filed on Apr. 20, 2021, which is a continuation-in-part of U.S. application Ser. No. 17/130,103, filed on Dec. 22, 2020, which is a continuation application of U.S. application Ser. No. 16/247,573, filed on Jan. 15, 2019. The contents of these applications are incorporated herein by reference.

BACKGROUND OF THE INVENTION

1. Field of the Invention

The invention relates to a mechanism of a sensor patch circuit assembled into an electronic device, and more particularly to an earphone device comprising the force sensor patch circuit and a corresponding assembly method procedure.

2. Description of the Prior Art

Generally speaking, a conventional method for assembling a conventional larger sensor circuit to an electronic device such as an earphone device inevitably needs to use and install an additional retention assembly component to keep the location of the larger sensor circuit at a circuit board inside the electronic device. However, this additional retention assembly component comparatively occupies a considerable internal circuit space of the electronic device. In addition, further installing the additional retention assembly component becomes complicated for the assembly procedure.

SUMMARY OF THE INVENTION

Therefore one of the objectives of the invention is to provide an earphone device, a force sensor patch, and a method for assembling the force sensor patch within the earphone device, to solve the above-mentioned problems.

According to the embodiments, an earphone device is disclosed. The earphone device comprises a housing subassembly, an inner casing subassembly, an audio processor, and a force sensor patch. The inner casing subassembly is disposed in the housing subassembly and integrated with a printed circuit board having at least one specific electrode. The audio processor is disposed on the printed circuit board. The force sensor patch is pasted onto the at least one specific electrode of the printed circuit board to be coupled to the audio processor through the at least one specific electrode. The force sensor patch is disposed between a part of the housing subassembly and a part of the inner casing subassembly and arranged to detect a user's pressure applied onto the part of the housing subassembly.

According to the embodiments, a method for assembling an earphone device is disclosed. The method comprises: providing a housing subassembly; providing and disposing an inner casing subassembly inside the housing subassembly to be integrated with a printed circuit board having at least one specific electrode; providing and installing an audio processor on the printed circuit board; and providing and pasting a force sensor patch onto the at least one specific electrode of the printed circuit board to be coupled to the audio processor through the at least one specific electrode; wherein the force sensor patch is disposed between a part of the housing subassembly and a part of the inner casing subassembly and arranged to detect a user's pressure applied onto the part of the housing subassembly.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution mechanism of providing and applying a small (or minuscule) and thin film force sensor patch (or a sensor tab) into an electronic device wherein the small (or minuscule) and thin film force sensor patch can be self-adhesive (pasteable and stickable) or it can be sticky and pasted (by using an adhesive) to at least one sensing electrode E1 of a printed circuit such as a printed circuit board (PCB) or a flexible printed circuit (FPC) within the electronic device. Alternatively, it can be adhered to (or stuck to) a specific circuit, e.g. a battery circuit, within the electronic device such as an earphone device (but not limited). In response to different applications, the force sensor patch integrated within the electronic device can be arranged to detect the user's control force/pressure applied for the electronic device and/or to be used as a G-sensor (i.e. accelerometer) to detect and sense sudden acceleration and deceleration of the electronic device. For example (but not limited), the force sensor patch may be formed and implemented by using a macromolecular material. The electronic device for example can be an earphone device such as a wired headphone, a true wireless earphone, a true wireless stereo (TWS) earphone, or a wireless earbud; the electronic device for example supports a wireless communication such as Bluetooth communication protocol or other wireless communication protocols.

An advantage of the provided force sensor patch is that it does not significantly occupy the inner space of the electronic device (i.e. it can significantly save the inner space of the electronic device), so that more circuit components can be installed within the electronic device. Another advantage of the force sensor patch is that the assembly process/procedure for assembling the force sensor patch into the electronic device will become more convenient for the user or the manufacturer since it is easy to paste the force sensor patch onto a top/side surface of a component such as PCB or battery inside the electronic device. In addition, in one embodiment, for a single electronic device, more small and thin film force sensor patches can be disposed and adhered to component(s) inside the electronic device.

Figure 1:
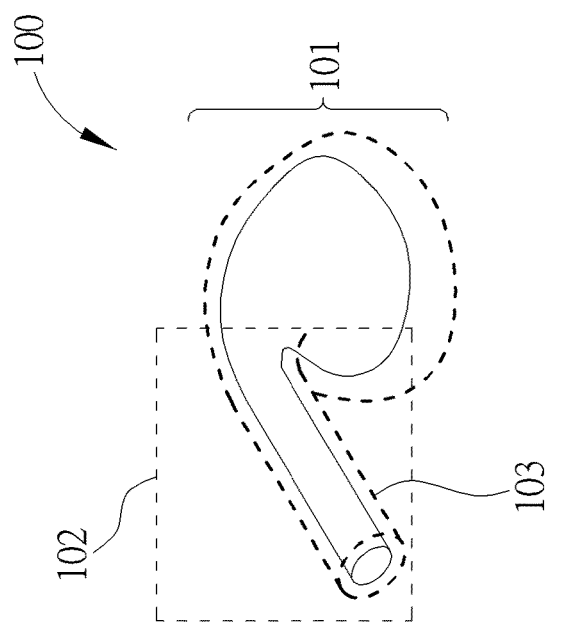
FIG. 1 is a schematic mechanism diagram showing different side and cross-section views of an electronic device such as an earphone device according to an embodiment of the invention.
Figure 1:
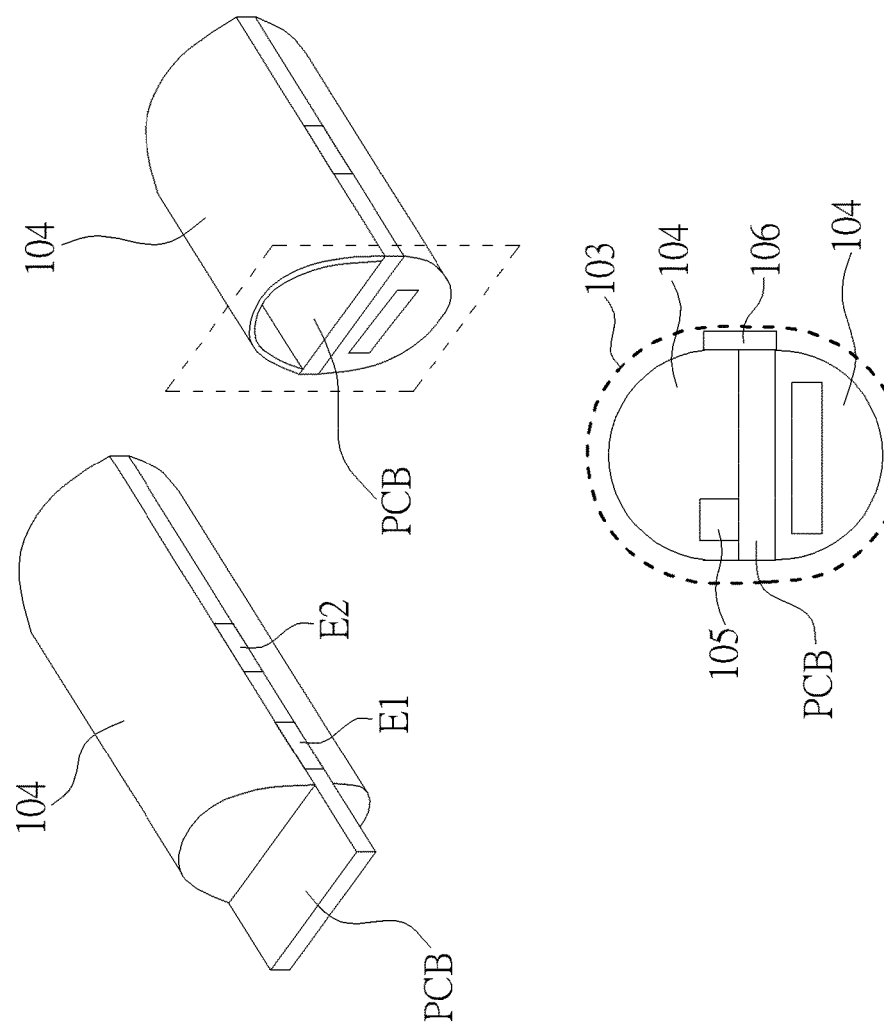

FIG. 1 is a schematic mechanism diagram showing different sides and cross-section views of an electronic device such as an earphone device 100 according to an embodiment of the invention. The earphone device 100 comprises a main portion/body 101 and a stem portion/body 102 which can contain a battery cell/circuit (not shown in FIG. 1). The earphone device 100 comprises a housing (housing subassembly or shell casing subassembly) 103, an inner casing (inner casing subassembly) 104, a processor 105 such as an audio processor 105 (e.g. audio signal processing circuit), and a sensor patch (e.g. a force sensor patch) 106. The main portion 101 and/or stem portion 102 may be formed by the different parts of housing subassembly 103.

The inner casing subassembly 104 is disposed inside or within the housing subassembly 103 and is integrated with a printed circuit such as a printed circuit board (PCB) having one or more specific electrodes such as the sensing electrode E1, ground electrode E2, or other electrode(s). For example (but not limited), the inner casing subassembly 104 is disposed in an inner empty space (i.e. a tube-shape empty space) formed by the housing subassembly 103, and it may comprise a first portion/part and a second portion/part wherein the first portion/part may be an long-shape arched upper cover portion and the second portion/part may be another long-shape arched bottom cover portion. The PCB and/or the minuscule battery cell/circuit may be disposed in an inner empty space formed by the upper and bottom cover portions of the inner casing subassembly 104, and the sensing electrode E1 and ground electrode E2 of the PCB is not covered by either the upper cover portion or the bottom cover portion, and the sensing electrode E1 and ground electrode E2 can be connected and coupled to a surface (e.g. bottom surface) of the force sensor patch 106. The inner casing subassembly 104 is arranged to protect the PCB, circuit component(s), and the battery circuit from being damaging. The upper cover portion of inner casing subassembly 104 and the PCB may together form an inner empty circuit space with a semicircular column shape (but not limited), and the audio processor 105 can be disposed at the PCB and inside the inner empty circuit space. The PCB for example (but not limited) may have at least one specific electrode such as the two electrodes E1 and E2 and other electrodes wherein the two electrodes E1 and E2 may be at one side or at the top of PCB.

The force sensor patch 106 can be pasted/adhered onto at least one specific electrode of PCB to be coupled to the audio processor 105 installed on PCB. In practice, as shown in FIG. 1, two or more electrodes can be disposed at one side (e.g. the same side) of the PCB, and the force sensor patch 106 may be pasted onto the electrodes at the surface at the side and the location of force sensor patch 106 can be disposed between a part of the housing subassembly 103 and a part of the inner casing subassembly 104 and arranged to detect a user's pressure applied onto the part of the housing subassembly 103.

Figure 2:
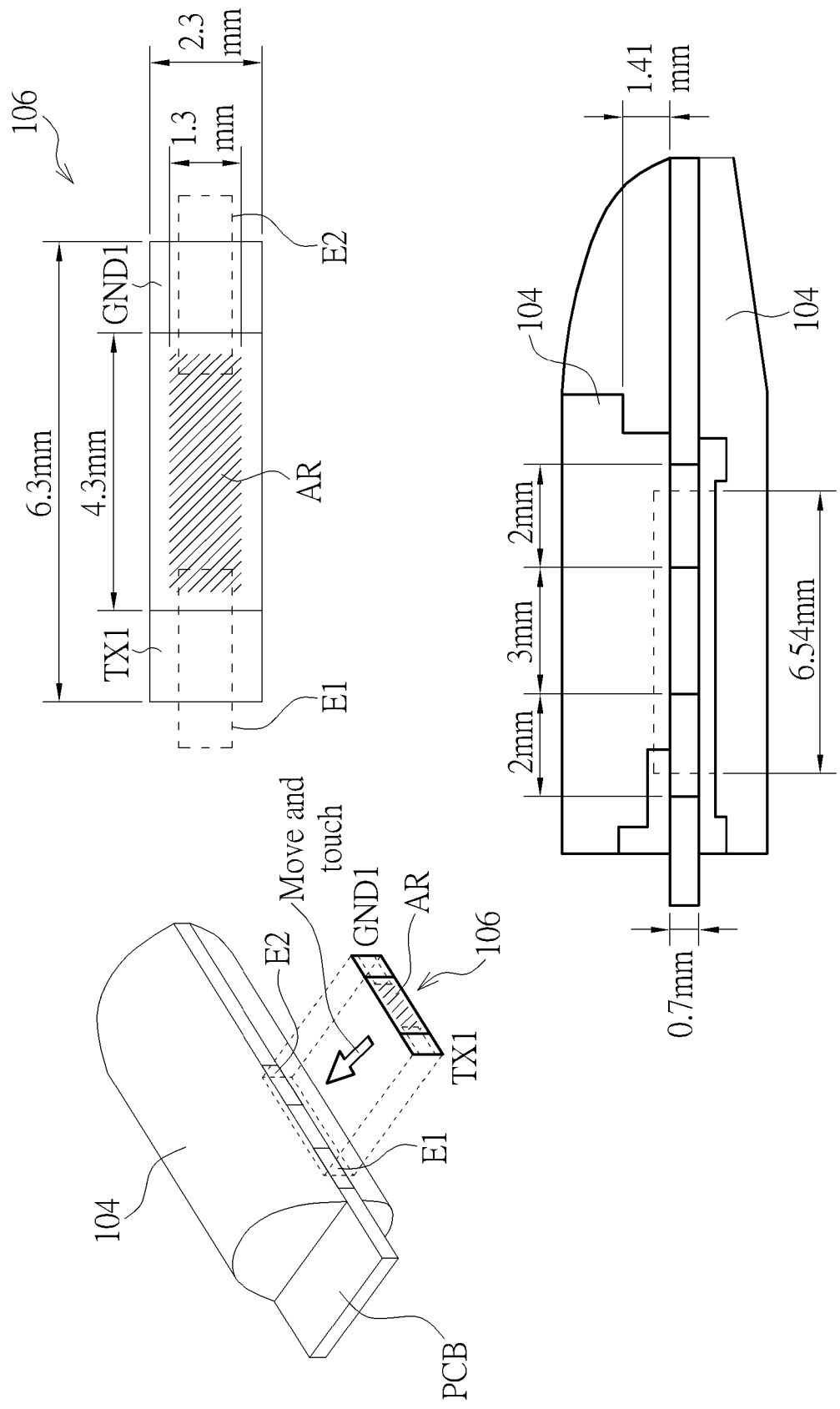
FIG. 2 is a diagram showing an assembly method of the force sensor patch into the earphone device in FIG. 1 according to an embodiment of the invention.

FIG. 2 is a diagram showing an assembly method of the force sensor patch 106 into the earphone device 100 in FIG. 1 according to an embodiment of the invention. As shown in FIG. 2, for example (but not limited), the force sensor patch 106 may be a small and thin film force sensor patch which comprises atop surface without adhesive material portions and a bottom surface with one or more adhesive material portions. In practice, the force sensor patch 106 at its bottom surface comprises an active sensing area AR, a first conductive portion such as a transmission metal pad TX1, and a second conductive portion such as a ground metal pad GND1 respectively. The partial or whole surfaces of transmission metal pad TX1 and ground metal pad GND1 may be coated with conductive adhesive materials, and the active sensing area AR is not coated with the conductive adhesive material. The transmission metal pad TX1 and ground metal pad GND1 are disconnected and separated by the active sensing area AR. For the assembly procedure, a user may merely needs to move and make the bottom surface of force sensor patch 106 be closely touched into the surface of the electrodes E1 and E2 at the side of PCB. The transmission metal pad TX1 can be pasted onto the sensing electrode E1 of the PCB, and the ground metal pad GND1 can be pasted onto the ground electrode E2 of PCB.

The active sensing area AR is arranged to detect the user's pressure applied onto the part of the housing subassembly 103, and the force sensor patch 106 can transmit and report the detected pressure to the audio processor 105 through the transmission metal pad TX1 and ground metal pad GND1. In one embodiment, for example (but not limited), the bottom surface of thin film force sensor patch 106 may have a length equal/approximate to 6.3 mm (millimeter) and a width equal/approximate to 2.3 mm, the transmission metal pad TX1 may have a width equal/approximate to the width of the bottom surface of the thin film force sensor patch 106 (e.g. 2.3 mm) and a length equal to or smaller than its width, the ground metal pad GND1 may have a width equal/approximate to the width of the bottom surface of the thin film force sensor patch 106 (e.g. 2.3 mm) and a length equal to or smaller than its width, and the active sensing area AR may have a length equal/approximate to 4.6 mm and a width equal/approximate to 2.3 mm. However, the above-mentioned values are not intended to be a limitation of the invention.

In addition, in one embodiment, one electrode at the side of PCB may have a rectangular area having a length greater than those of the transmission metal pad TX1 and ground metal pad GND1 and a width smaller than those of the transmission metal pad TX1 and ground metal pad GND1, as indicated by FIG. 2; however, this is not intended to be a limitation. Similarly, the values of length and width of each component unit/part (e.g. inner casing subassembly 104) of the earphone device 100 are for example specified in FIG. 2; this is also not meant to be a limitation.

The sensor assembly procedure becomes very convenient since it merely needs to move and make the force sensor patch's 106 bottom surface correspondingly touch onto the corresponding areas/electrodes at the side of PCB. The force sensor patch 106 can be automatically adhered onto the side of the PCB. After the housing subassembly 103 is packaged to contain or cover the inner casing subassembly 104 and PCB, the force sensor patch 106 can be automatically disposed between a part of the housing subassembly 103 and a part of the inner casing subassembly 104 so as to detect the user's force control applied upon the housing subassembly 103.

Figure 3:
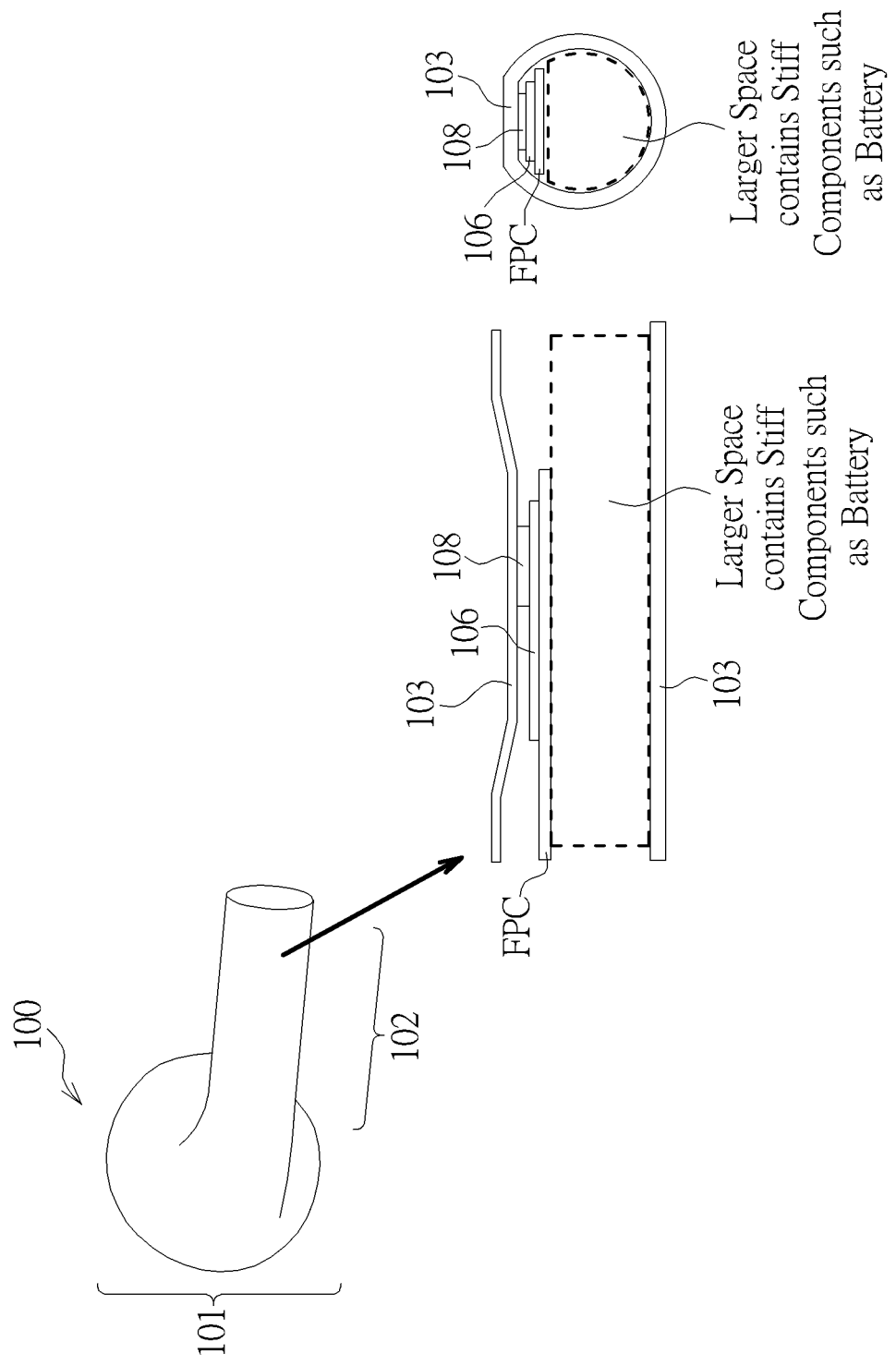
FIG. 3 is a diagram showing another example of the earphone device and side section views of its stem portion according to an embodiment of the invention.

FIG. 3 is a diagram showing another example of the earphone device 100 and side section views of its stem portion 102 according to an embodiment of the invention. As shown in FIG. 3, in this embodiment, the force sensor patch 106 can be a thin film circuit which is pasted and adhered onto the printed circuit such as an FPC, to generate a larger inner empty space (indicated by dotted lines) which can be configured to contain stiff or inflexible component such as the battery circuit/cell. Further, a specific spacer unit 108, e.g. a flexible spacer, can be disposed between a part of the housing subassembly 103 and a part of the force sensor patch 106, so as to have enough tolerance for the package of housing subassembly 103. The advantage of the thin film force sensor patch 106 is thin, flat, and flexible, so that the stem portion 102 can have a larger inner empty space to contain the battery circuit and/or more components such as a microphone component. For example, the FPC, specific spacer 108, or the force sensor patch 106 may have 0.5 mm in thickness; however, this is not intended to be a limitation.

Figure 4:
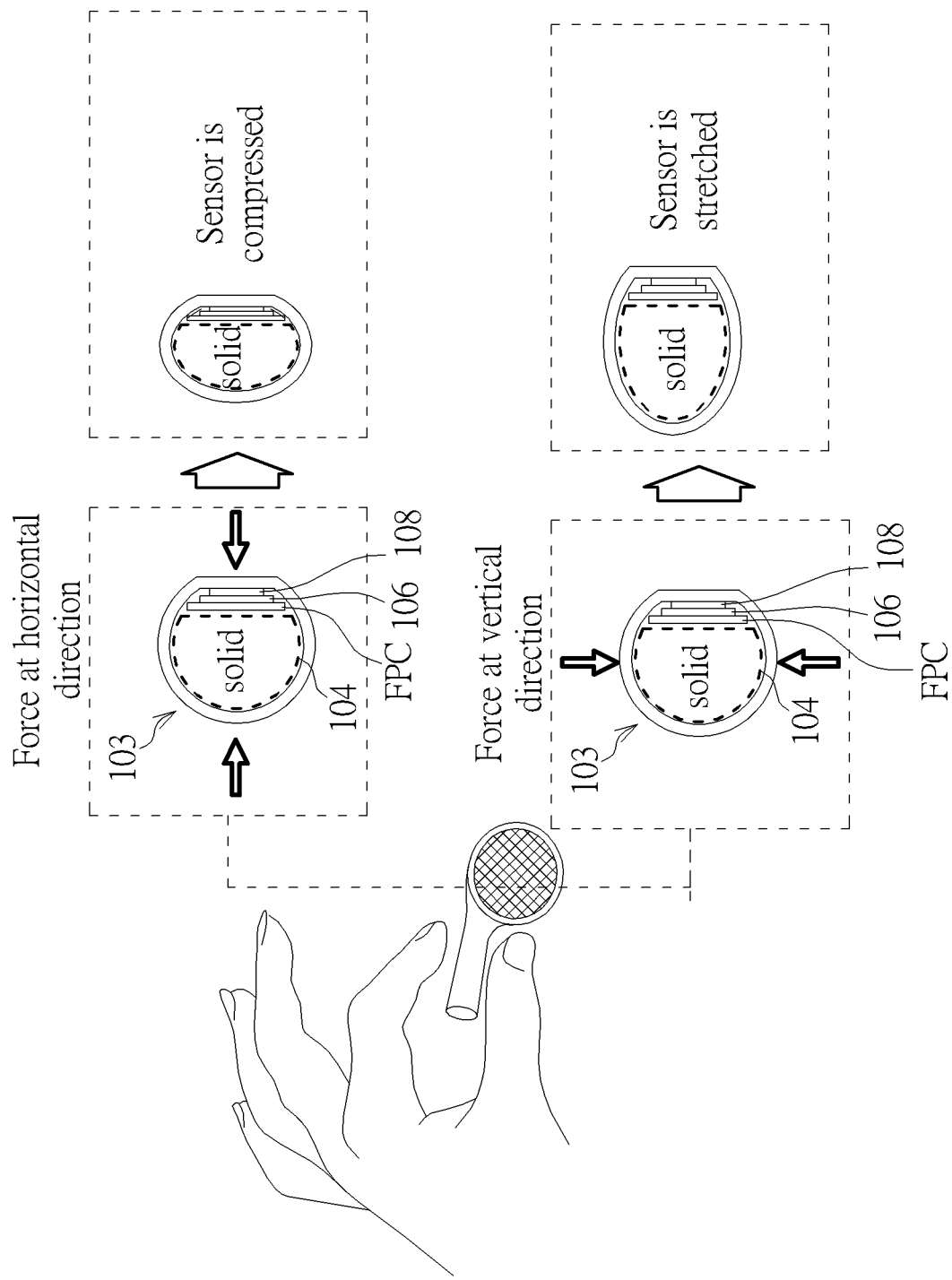
FIG. 4 is a diagram showing an example of the earphone device of FIG. 3 which supports the pressing function at different directions according to an embodiment of the invention.

FIG. 4 is a diagram showing an example of the earphone device 100 of FIG. 3 which supports the pressing function at different directions according to an embodiment of the invention. The force sensor patch 106, disposed between the housing subassembly 103 and inner casing subassembly 104, can be preferably a capacitor-type force sensor patch (but not limited) and arranged to have a form-fit or force-fit connection with a part of the housing subassembly 103 so as to have/preload specific or enough pressure. The force sensor patch 106 is a capacitance-type force sensor patch made with a polymer material layer, and when the polymer material layer is pressed, a dielectric constant thereof is changed accordingly. A capacitance of the force sensor patch 106 could be varied by the dielectric constant.

As shown in FIG. 4, the user can apply different force pressures at different force directions upon the earphone device 100. For example (but not limited), if the user horizontally applies a force pressure upon the earphone device 100, then the force sensor patch 106 disposed between the housing subassembly 103 and inner casing subassembly 104 will be compressed and its capacitance will be increased so as to generate and obtain a positive indication signal corresponding to the increased capacitance. If the user vertically applies another force pressure upon the earphone device 100, then the force sensor patch 106 will be stretched and its capacitance will be decreased so as to generate and obtain a negative indication signal corresponding to the decreased capacitance. By doing so, the force sensor patch 106 can detect the user's different force directions and different pressures.

Figure 5:
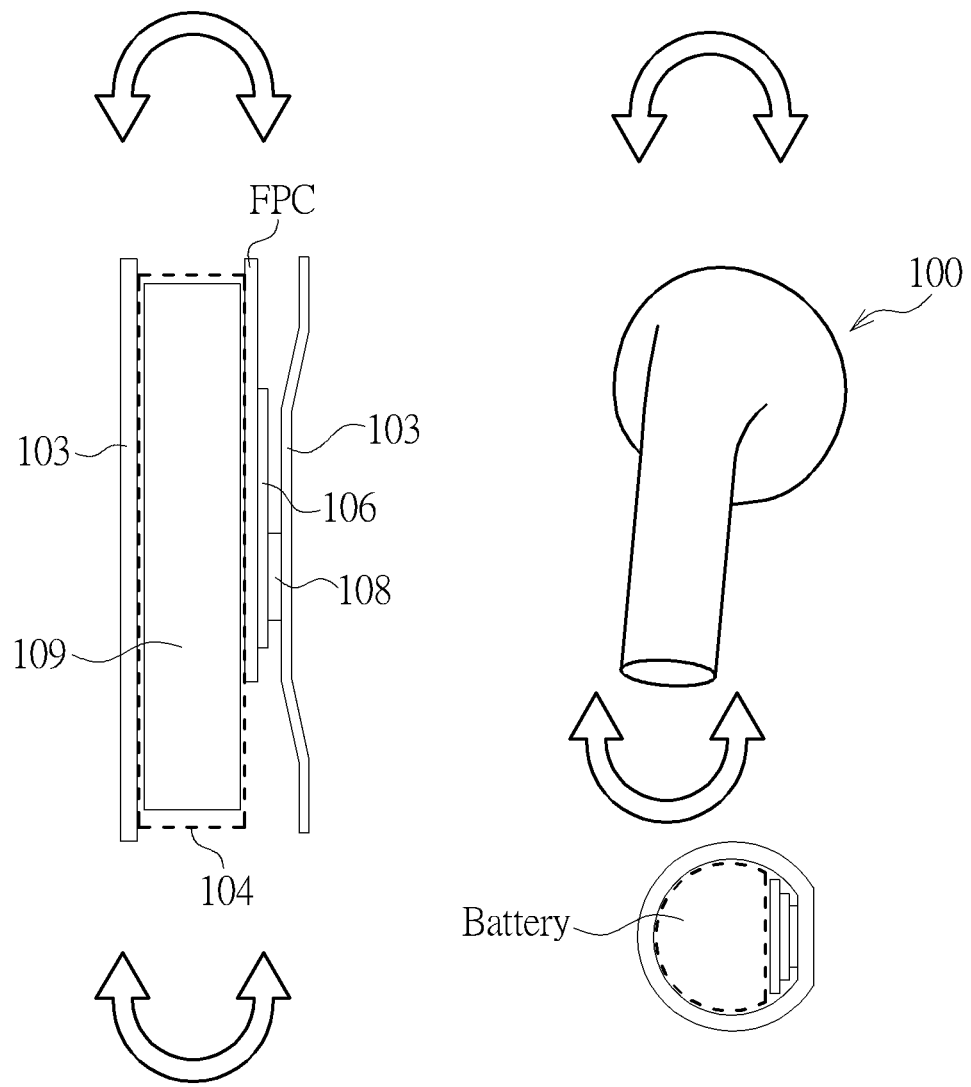
FIG. 5 is a diagram showing an example scenario and different side section views of the earphone device in FIG. 3 being used as a G-sensor according to another embodiment of the invention.

FIG. 5 is a diagram showing an example scenario and different side section views of the earphone device 100 in FIG. 3 being used as a G-sensor according to another embodiment of the invention. The force sensor patch 106, disposed between the housing subassembly 103 and inner casing subassembly 104, can be preferably a capacitor-type force sensor patch (but not limited) and arranged to have a form-fit or force-fit connection with a part of the inner casing subassembly 104 so as to correspondingly have a form-fit or force-fit connection with a battery device 109 such as a battery circuit disposed in the inner empty space formed by the inner casing subassembly 104 to have/preload specific or enough pressure. In this scenario, the battery device 109 equivalently is integrated with the inner casing subassembly 104, and the force sensor patch 106 can be arranged as a gravity sensing circuit to detect sudden acceleration or deceleration of the battery device 109 so as to sense sudden acceleration or deceleration of the earphone device 100. In this embodiment, the force sensor patch 106 can be arranged to detect the user's different control forces as well as to detect the sudden acceleration or deceleration of the earphone device 100 to generate a G-sensor result signal to the audio processor 105, so that the audio processor 105 (or earphone device 100) can determine which control command/behavior is made by the user and for example can avoid the earphone device 100 falling out of the user's ear based on the G-sensor result signal. Further, in other embodiment, the inner casing subassembly 104 may have a specific hole through which the force sensor patch 106 may be adhered to a portion of a surface of the battery device 109 and arranged as a gravity sensing circuit to detect sudden acceleration or deceleration of the battery device to sense sudden acceleration or deceleration of the earphone device 100. This also falls within the scope of the invention.

Figure 6:
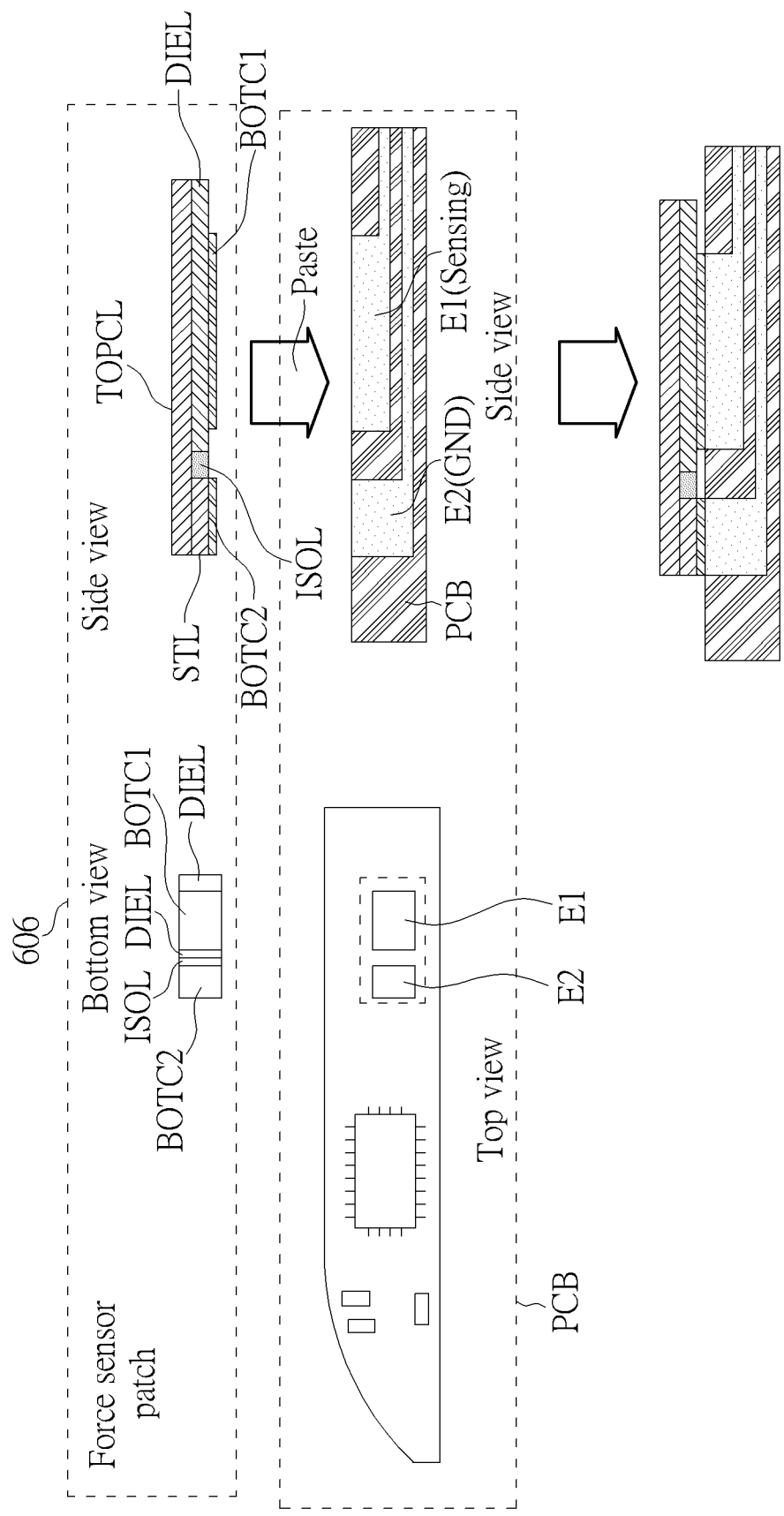
FIG. 6 is a diagram of an assembly method procedure of assembling the force sensor patch onto a surface of the PCB according to an embodiment of the invention.

FIG. 6 is a diagram of an assembly method procedure of assembling the force sensor patch 606 onto a surface of the PCB according to an embodiment of the invention. As shown in FIG. 6, the surface of PCB may be a top surface or it can be a side surface in other embodiment; this is not intended to be a limitation. The operations of assembling the force sensor patch 606 onto the top and into the side surface(s) of the PCB are similar. The force sensor patch 606 for example is also a capacitance-type force sensor patch as mentioned above and has a bottom view and a side view. The side view of force sensor patch 606 shows that the force sensor patch 606 comprises a top electrically conductive layer portion TOPCL at its top surface, an intermediate dielectric layer portion DIEL (i.e. the polymer material layer), an isolation layer portion ISOL, a signal transfer layer portion STL, a first bottom electrically conductive portion BOTC1 (e.g. a self-adhesive and conductive material portion) disposed at its bottom surface, and a second bottom electrically conductive portion BOTC2 (e.g. a self-adhesive and conductive material portion) disposed at its bottom surface. The conductive portions BOTC1 and BOTC1 can be self-adhesive layer portions and for example are not liquid; however, this is not a limitation. As shown in FIG. 6, the force sensor patch 606 comprises a top layer, an intermediate layer, and a bottom layer. The top layer is formed by top electrically conductive layer portion TOPCL, the intermediate layer is formed by the intermediate dielectric layer portion DIEL, isolation layer portion ISOL, and the signal transfer layer portion STL. The bottom layer is formed by the two bottom electrically conductive portions BOTC1 and BOTC2. The bottom view of force sensor patch 606 respectively shows the bottom surfaces of the two bottom electrically conductive portions BOTC1 and BOTC2, isolation layer portion ISOL, and the partial bottom surface of intermediate dielectric layer portion DIEL. The two bottom electrically conductive portions BOTC1 and BOTC2 are separated and disconnected.

The PCB has a top view and a side view. The top view of PCB shows a dotted region in which two areas are configured as the sensing electrode E1 and the ground electrode E2 to be respectively coupled to a sensing end/signal and a ground end/signal of the force sensor patch 606. The side view of PCB shows that the arrangement of different lines of the sensing electrode E1 and ground electrode E2 of PCB. According to the assembly procedure, the two bottom electrically conductive portions BOTC1 and BOTC2 have the conductive and self-adhesive materials, the assembly procedure becomes very convenient since the user only needs to paste the bottom surface of the force sensor patch 606 onto the specified region at the top surface of the PCB to make the bottom electrically conductive portions BOTC1 and BOTC2 be respectively adhered to the sensing electrode E1 and the ground electrode E2.

The force sensor patch 606 for example is a capacitive pressure sensor. The intermediate dielectric layer portion DIEL is flexible and has a top surface and a bottom surface, and its capacitance is arranged to vary or change corresponding to the variance of the dielectric constant when it is pressed or de-pressed with or without the distance change between its top surface and bottom surface applied by the user. The processor 105 can obtain the changed capacitance through the first bottom electrically conductive portion BOTC1, the sensing electrode E1 and sensing signal line at PCB, the top electrically conductive layer portion TOPCL, the signal transfer layer portion STL, the second bottom electrically conductive portion BOTC2, and the ground electrode E2 and ground signal line at PCB. Then, the processor 105 can estimate and calculate the pressure based on the obtained capacitance.

Figure 7:
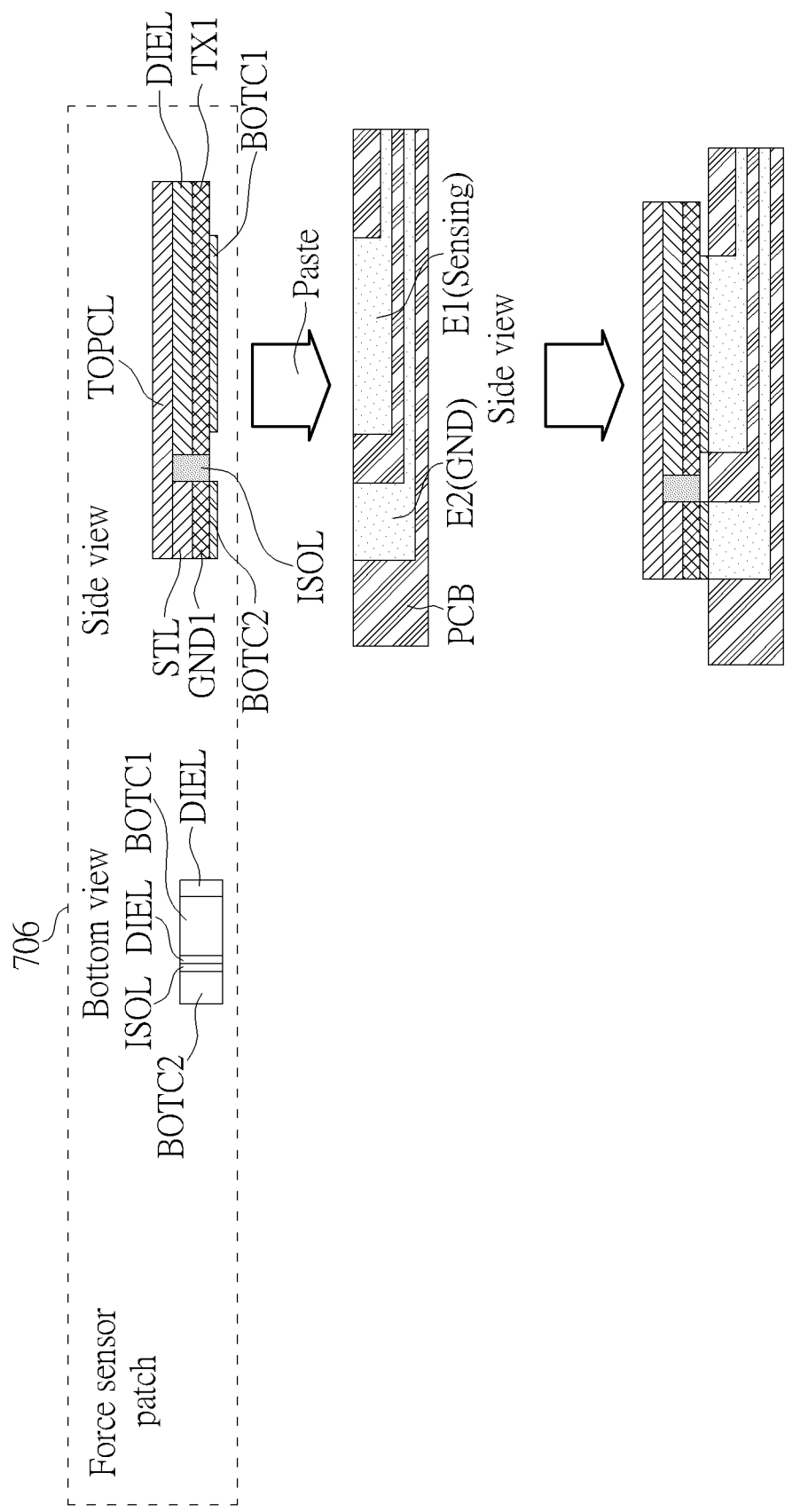
FIG. 7 is a diagram of an assembly method procedure of assembling the force sensor patch onto a top or side surface of the PCB according to another embodiment of the invention.

In other embodiments, a force sensor patch may further have conductive portions such as metal pads. FIG. 7 is a diagram of an assembly method procedure of assembling the force sensor patch 706 onto a top or side surface of the PCB according to another embodiment of the invention. As shown in FIG. 7, the surface of PCB may be a top surface or it can be a side surface in other embodiment; this is not intended to be a limitation. The operations of assembling the force sensor patch 706 onto the top or side surfaces of the PCB may be similar. Similarly, the force sensor patch 706 for example is a capacitance-type force sensor patch and has a bottom view and a side view. The side view shows that the force sensor patch 706 comprises a top layer (the top electrically conductive layer portion TOPCL at the top surface), a first intermediate layer (the intermediate dielectric layer portion DIEL, the top half of isolation layer portion ISOL, and the signal transfer layer portion STL), a second intermediate layer (a ground metal pad/portion GND1, a sensing/transmission metal pad/portion TX1, and a bottom half of isolation layer portion ISOL), and a bottom layer (the first bottom electrically conductive portion BOTC1 and the second bottom electrically conductive portion BOTC2). The bottom view of force sensor patch 706 respectively shows the bottom surfaces of the two bottom electrically conductive portions BOTC1 and BOTC2, isolation layer portion ISOL, and the partial bottom surfaces of transmission metal pad/portion TX1.

Identically, after the assembly procedure is completed and the housing subassembly 103 is packaged, when a user applies a force pressure upon a portion/part of the housing subassembly 103, the capacitance generated by the intermediate dielectric layer portion DIEL is changed correspondingly. The processor 105 can obtain a changed capacitance through the metal pad/portion TX1, the first bottom electrically conductive portion BOTC1, the sensing electrode E1 and sensing signal line at PCB, the top electrically conductive layer portion TOPCL, the signal transfer layer portion STL, the metal pad/portion GND1, the second bottom electrically conductive portion BOTC2, and the ground electrode E2 and ground signal line at PCB. Then, the processor 105 can estimate and calculate the pressure based on the obtained capacitance.

Figure 8:
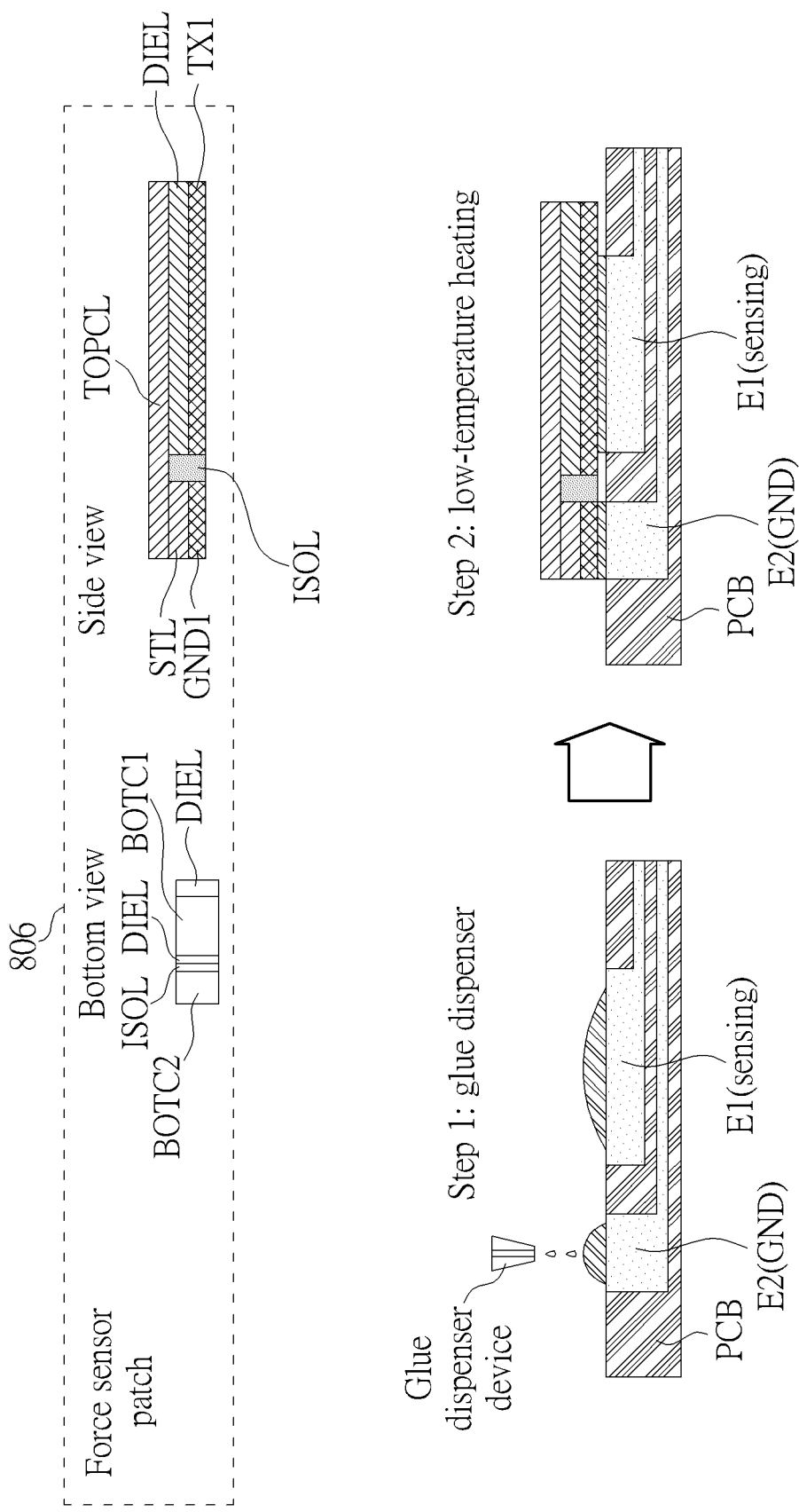
FIG. 8 is a diagram of an assembly method procedure of assembling the force sensor patch onto a surface of the PCB according to another embodiment of the invention.

FIG. 8 is a diagram of an assembly method procedure of assembling the force sensor patch 806 onto a surface of the PCB according to another embodiment of the invention. The force sensor patch 806 for example is a capacitance-type force sensor patch and has a bottom view and a side view. The side view of force sensor patch 806 shows that the force sensor patch 806 comprises a top layer (the top electrically conductive layer portion TOPCL), an intermediate layer (the intermediate dielectric layer portion DIEL, a top half of the isolation layer portion ISOL, and the signal transfer layer portion STL), and a bottom layer (the ground metal pad/portion GND1, a bottom half of isolation layer portion ISOL, and the transmission metal pad/portion TX1). As shown in FIG. 8, in the first step, a glue dispenser device is arranged to generate or inject conductive glue adhesive drop-by-drop respectively onto the surfaces of sensing electrode E1 and ground electrode E2 on the top of the PCB. Then, in the second step, the bottom of the force sensor patch 806 is moved and touched onto the top surface of the region of the sensing electrode E1 and ground electrode E2, and then the liquid conductive glue adhesive drops are respectively heated with a lower temperature to become solidified so as to make the force sensor patch 806 stick with the PCB.

After the assembly method procedure is completed and the housing subassembly 103 is packaged, when a user applies a force pressure upon a portion/part of the housing subassembly 103, the capacitance generated by the intermediate dielectric layer portion DIEL is changed correspondingly. The processor 105 can obtain a changed capacitance through the metal pad/portion TX1, a portion of solidified conductive glue adhesive, the sensing electrode E1 and sensing signal line at PCB, the top electrically conductive layer portion TOPCL, the signal transfer layer portion STL, the metal pad/portion GND1, another portion of solidified conductive glue adhesive, and the ground electrode E2 and ground signal line at PCB. Then, the processor 105 can estimate and calculate the pressure based on the obtained capacitance.

Figure 9:
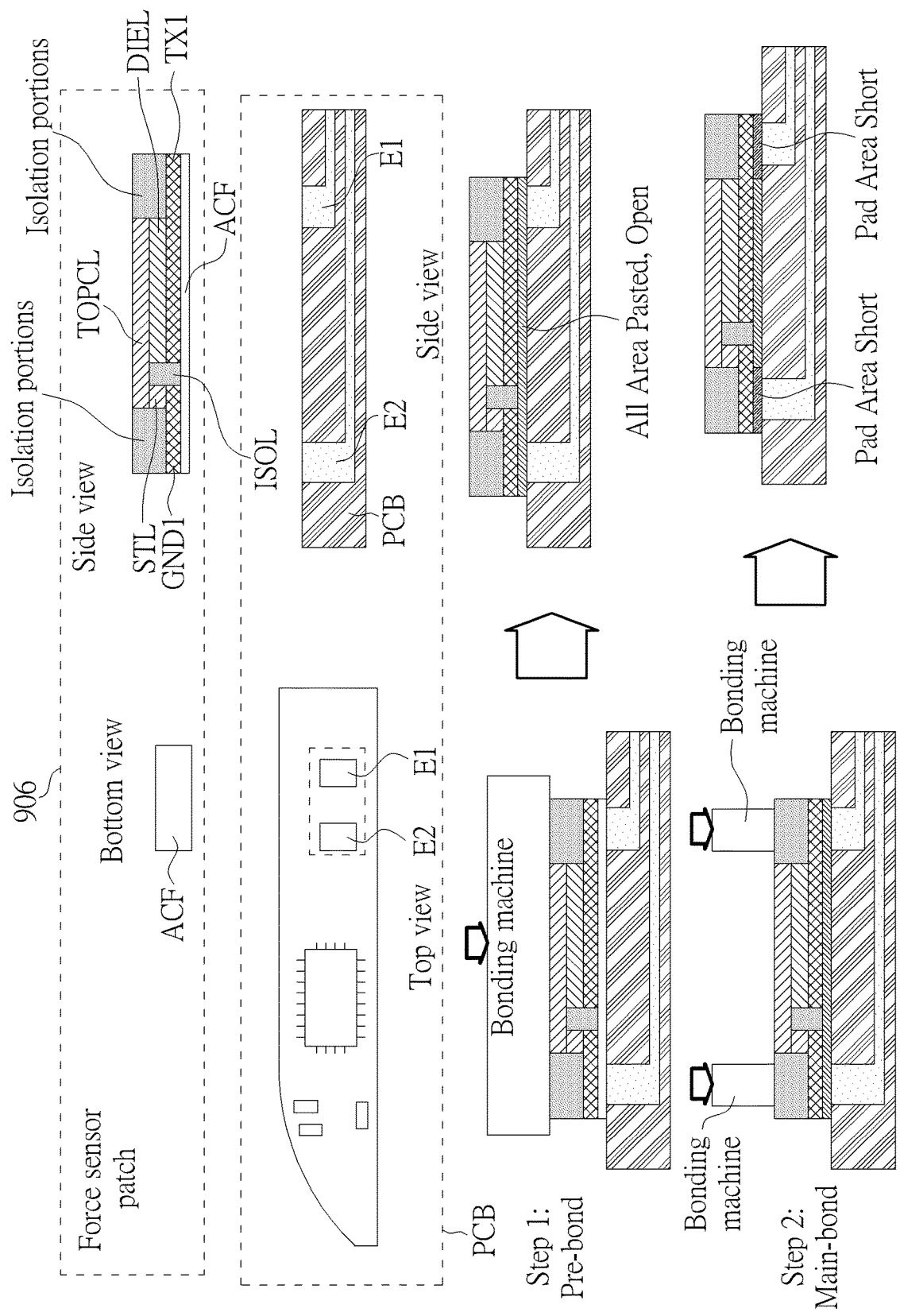
FIG. 9 is a diagram of an assembly method procedure of assembling the force sensor patch onto a surface of the PCB according to another embodiment of the invention.

FIG. 9 is a diagram of an assembly method procedure of assembling the force sensor patch 906 onto a surface of the PCB according to another embodiment of the invention. The force sensor patch 906 for example is a capacitance-type force sensor patch and has a bottom view and a side view. The side view of force sensor patch 906 shows that it comprises a top layer (the top electrically conductive layer portion TOPCL and two side portions (e.g. isolation portions)), a first intermediate layer (partial isolation portions, the signal transfer layer portion STL, a top half of the isolation layer portion ISOL, the intermediate dielectric layer portion DIEL), a second intermediate layer (the ground metal pad/portion GND1, a bottom half of isolation layer portion ISOL, and the transmission metal pad/portion TX1), and a bottom layer (an anisotropic conductive film (ACF)). The bottom view of force sensor patch 906 shows the bottom surface of the ACF. The ACF at least comprises a first portion, a second portion, and a third portion. The first portion is coupled to a bottom of the transmission metal pad/portion TX1 (i.e. the first conductive portion). The second portion is coupled to a bottom of ground metal pad/portion GND1 (i.e. the second conductive portion). The third portion is disposed between the first and second portions and is not conductive to separate the first and second portions. The first portion of the ACF and the second portion of the ACF are heated to become conductive and respectively adhered to the sensing electrode E1 of PCB and the ground electrode E2 of PCB. The top view and side view of PCB respectively show two slash-line areas corresponding to the sensing electrode E1 and ground electrode E2 at PCB.

As shown in FIG. 9, in the first step, a bonding machine is arranged to push the whole top surface of force sensor patch 906 to make the whole bottom surface of ACF be touched and fixed/bonded to the sensing electrode E1, ground electrode E2, and an intermediate region between the sensing electrode E1 and ground electrode E2 respectively at PCB during a first specific time period by using a first specific pressure to make the whole bottom surface of ACF be closely touched to the corresponding regions and using a first specific temperature to heat the ACF to make the ACF be bonded to the corresponding regions. For example (but not limited), the first specific time period may be four seconds, the first specific pressure may be between one megapascal (MPa) and three MPa, and the first specific temperature may be between 60° C. (degrees Celsius) and 80° C. In this situation, the bottom surface of ACF can be closely and firmly pasted onto the surface of the corresponding region at PCB, and the ACF does not yet become conductive, i.e. it is open at the circuit state. That is, the assembly method is arranged for adhering the first portion, the second portion, and the third portion of the ACF to the sensing electrode E1, the ground electrode E2, and another region respectively at PCB by forcing the ACF with the first specific pressure and heating the ACF with the first specific temperature during the first specific time period.

Then, in the second step, the bonding machine is arranged to respectively use two smaller bonding devices to push the corresponding partial regions at the top surface of force sensor patch 906 to make the corresponding partial regions at the bottom surface of ACF be conductive to the sensing electrode E1 and ground electrode E2 during a second specific time period by using a second specific pressure to make the corresponding partial regions at the bottom surface of ACF be closely touched to the corresponding regions of PCB and using a second specific temperature to heat the corresponding partial regions at the bottom surface of ACF to make the corresponding partial regions at the bottom surface of ACF become conductive. For example (but not limited), the second specific time period may be four seconds (or may be different from the first specific time period), the second specific pressure can be identical or different from the first specific pressure, and the second specific temperature may be between 120° C. and 180° C. and it is different from and higher than the first specific temperature. This makes that only the two regions of ACF, heated by a higher temperature, become conductive to transmit signals. That is, the assembling method is arranged for making the first portion of ACF be conductive by forcing the first portion of ACF with the second specific pressure and heating the first portion of ACF with the second specific temperature during the second specific time period, and is arranged for making the second portion of ACF be conductive by forcing the second portion of ACF with the second specific pressure and heating the second portion of ACF with the second specific temperature during the second specific time period. The method does not heat the third portion of ACF with the second specific temperature, so that the third portion is merely adhered to the another region at PCB and is not conductive. It should be noted that the third portion may at least comprise the part which is directly below the isolation layer portion ISOL and has the same width of the isolation layer portion ISOL; that is, the third portion is a part which is directly below the isolation layer portion ISOL and has a width identical to or greater than that of isolation layer portion ISOL.

Figure 10:
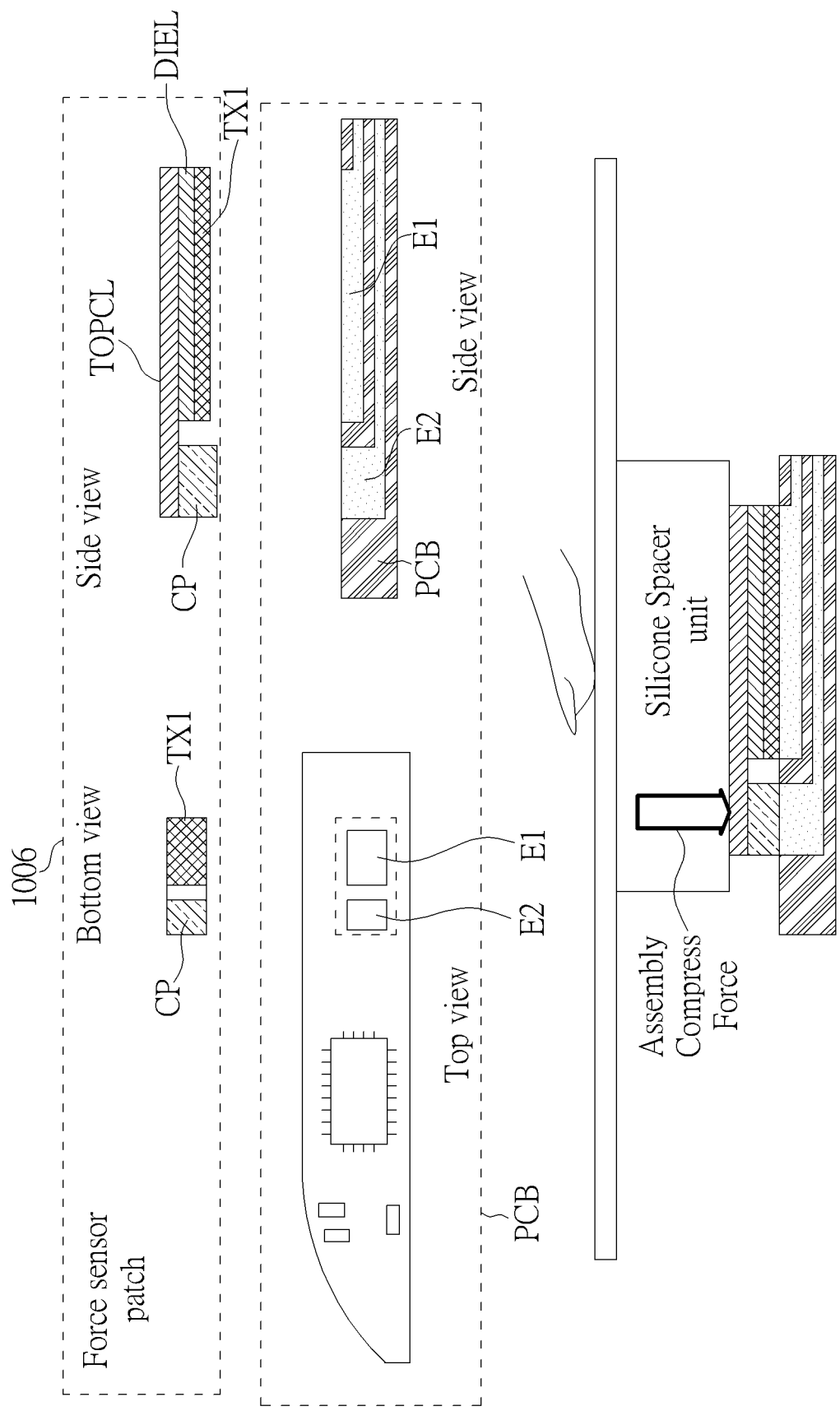
FIG. 10 is a diagram of an assembly method procedure of assembling the force sensor patch onto a surface of the PCB according to another embodiment of the invention.

FIG. 10 is a diagram of an assembly method procedure of assembling the force sensor patch 1006 onto a surface of the PCB according to another embodiment of the invention. The force sensor patch 1006 for example is a capacitance-type force sensor patch and has a bottom view and a side view. The side view of force sensor patch 1006 shows that it comprises a top layer (the top electrically conductive layer portion TOPCL), an intermediate layer (the intermediate dielectric layer portion DIEL and a partial portion of a compressible conductive portion/unit CP), and a bottom layer (another partial portion of the compressible conductive portion CP and the transmission metal pad/portion TX1). The compressible conductive portion CP having the conductive characteristic and it is configured to be disconnected from the intermediate dielectric layer portion DIEL and disconnected from the transmission metal pad/portion TX1, and the compressible unit for example is used to replace the function of the ground metal pad/portion GND1 mentioned above. As shown in FIG. 10, an empty space is designed between the compressible conductive portion CP and the intermediate dielectric layer portion DIEL (or transmission metal pad/portion TX1). The height of compressible conductive portion CP is higher than the total height of intermediate dielectric layer portion DIEL with the transmission metal pad/portion TX1. The bottom of the compressible conductive portion CP and the bottom of the transmission metal pad/portion TX1 can be coated with conductive and adhesive materials. Thus, during the assembly procedure, a user in the first step can correspondingly put the force sensor patch 1006 on the top surface of the dotted line region at PCB, and then in the second step the user can put a compressible spacer such as a silicone spacer unit on the top surface of the force sensor patch 1006; the silicone spacer unit is disposed between the portion TOPCL of force sensor patch 1006 and a part of housing subassembly 103. Then, the user can directly and easily apply an assembly compress force with a slight pressure upon a part of the housing subassembly 103 to make the force sensor patch 1006 be closely bonded to the dotted line region at PCB, so as to complete the assembly procedure. It should be noted that the height of the compressible conductive portion CP will be changed to become shorter than the original height of compressible conductive portion CP after the assembly procedure is completed.

Figure 11:
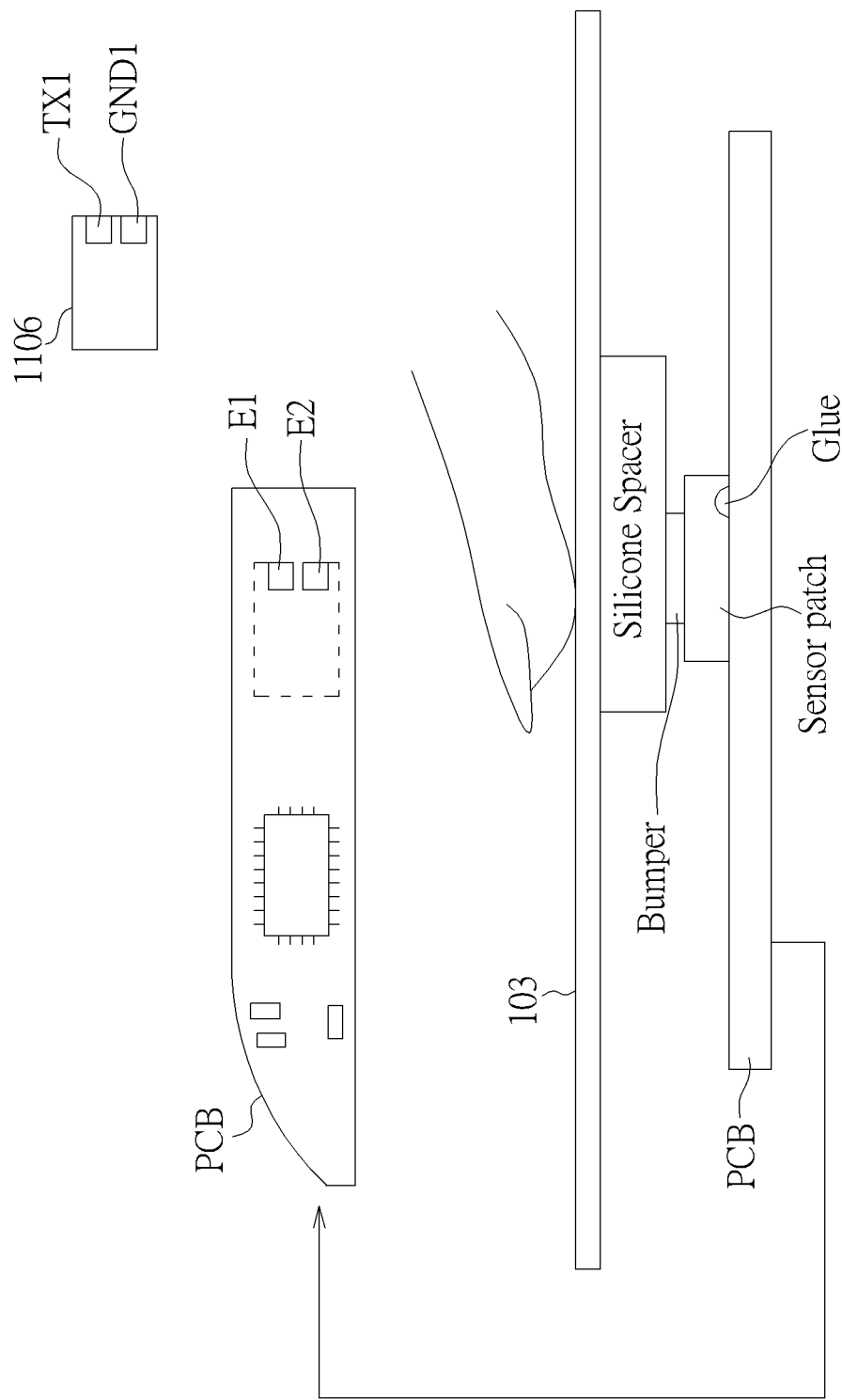
FIG. 11 is a diagram of an assembly method procedure of assembling the force sensor patch onto the surface of the PCB according to another embodiment of the invention.

FIG. 11 is a diagram of an assembly method procedure of assembling the force sensor patch 1106 onto the surface of the PCB according to another embodiment of the invention. The force sensor patch 1106 for example is a capacitance-type force sensor patch and may have the transmission metal pad/portion TX1 and ground metal pad/portion GND1 at the same side such as its bottom surface, and correspondingly the dotted-line region at the PCB is designed to have the sensing electrode E1 and ground electrode E2 at the same side, as shown in FIG. 11. For example (but not limited), the size of force sensor patch 1106 may be 2.5 mm by 3.5 mm, and its capacitance may range from zero to 15 pF (pico-farad). Similarly, during the assembly procedure, in the first step, a glue dispenser device is arranged to generate or inject conductive glue adhesive drop-by-drop respectively onto the surfaces of sensing electrode E1 and ground electrode E2 on the top of the PCB. Then, in the second step, the bottom surface of the force sensor patch 1106 is moved and touched onto the top surface of the region of the sensing electrode E1 and ground electrode E2, and in the third step the user can put a silicone spacer unit on the top surface of the force sensor patch 1106 (e.g. onto the bumper of force sensor patch 1106). Then, after the housing subassembly 103 is packaged, the user can directly and easily apply an assembly compress force with a slight pressure upon a part of the housing subassembly 103 to make the force sensor patch 1006 be closely touched and bonded to the dotted line region at PCB, so as to complete the assembly procedure.

Figure 12:
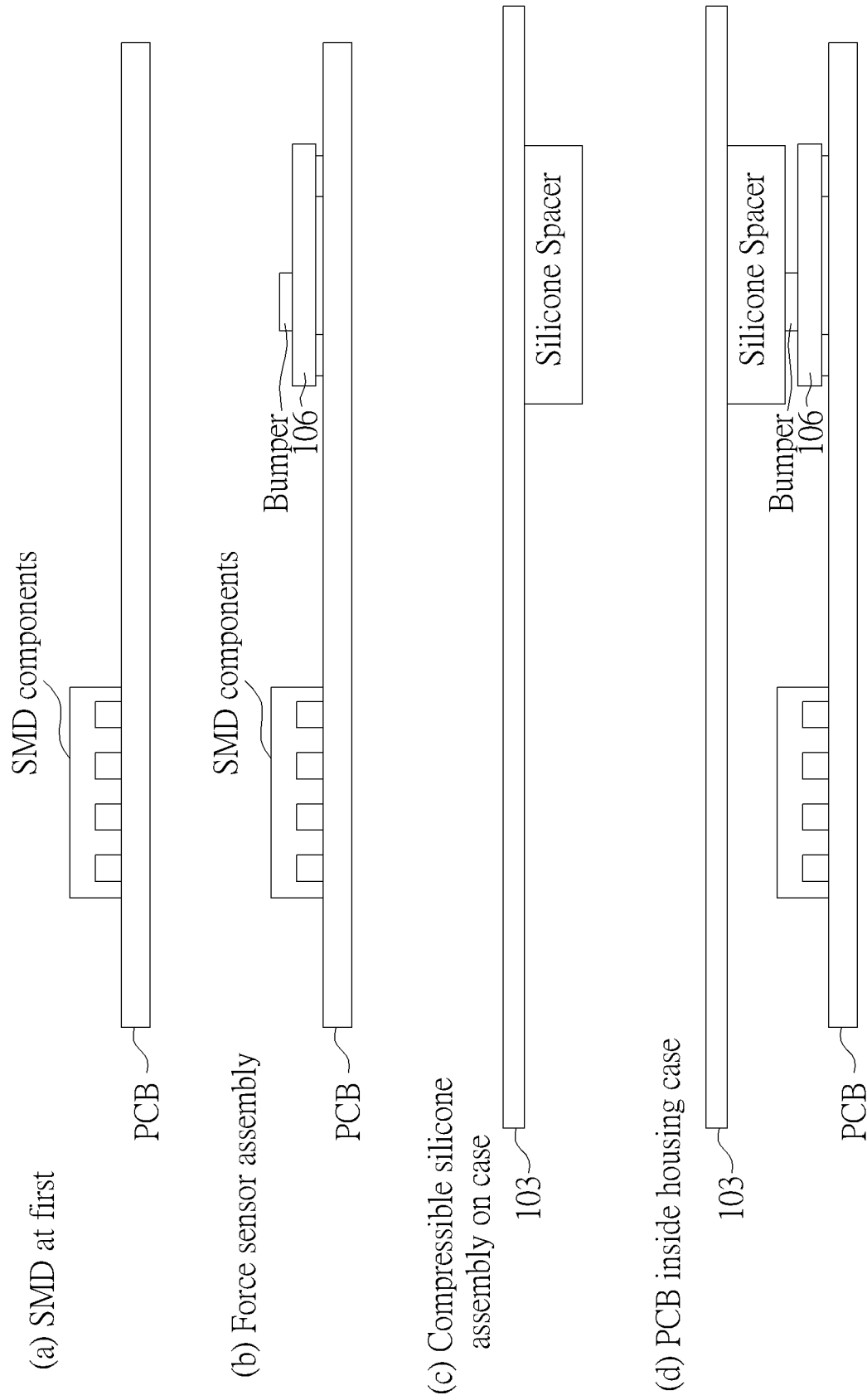
FIG. 12 is a diagram of an assembly procedure of earphone device according to an embodiment of the invention.

FIG. 12 is a diagram of an assembly procedure of earphone device 100 according to an embodiment of the invention. As shown in FIG. 12, for example (but not limited), circuit device(s) such as SMD (Surface-Mounted Device) component(s) may be disposed and installed onto the PCB in the step (a). Then, in the step (b), the force sensor patch 106 can be assembled and pasted onto a partial surface of the PCB. Then, in the steps (c) and (d), the housing subassembly 103 having a silicone spacer unit which is compressible may be packaged to cover/contain the PCB.

Figure 13:
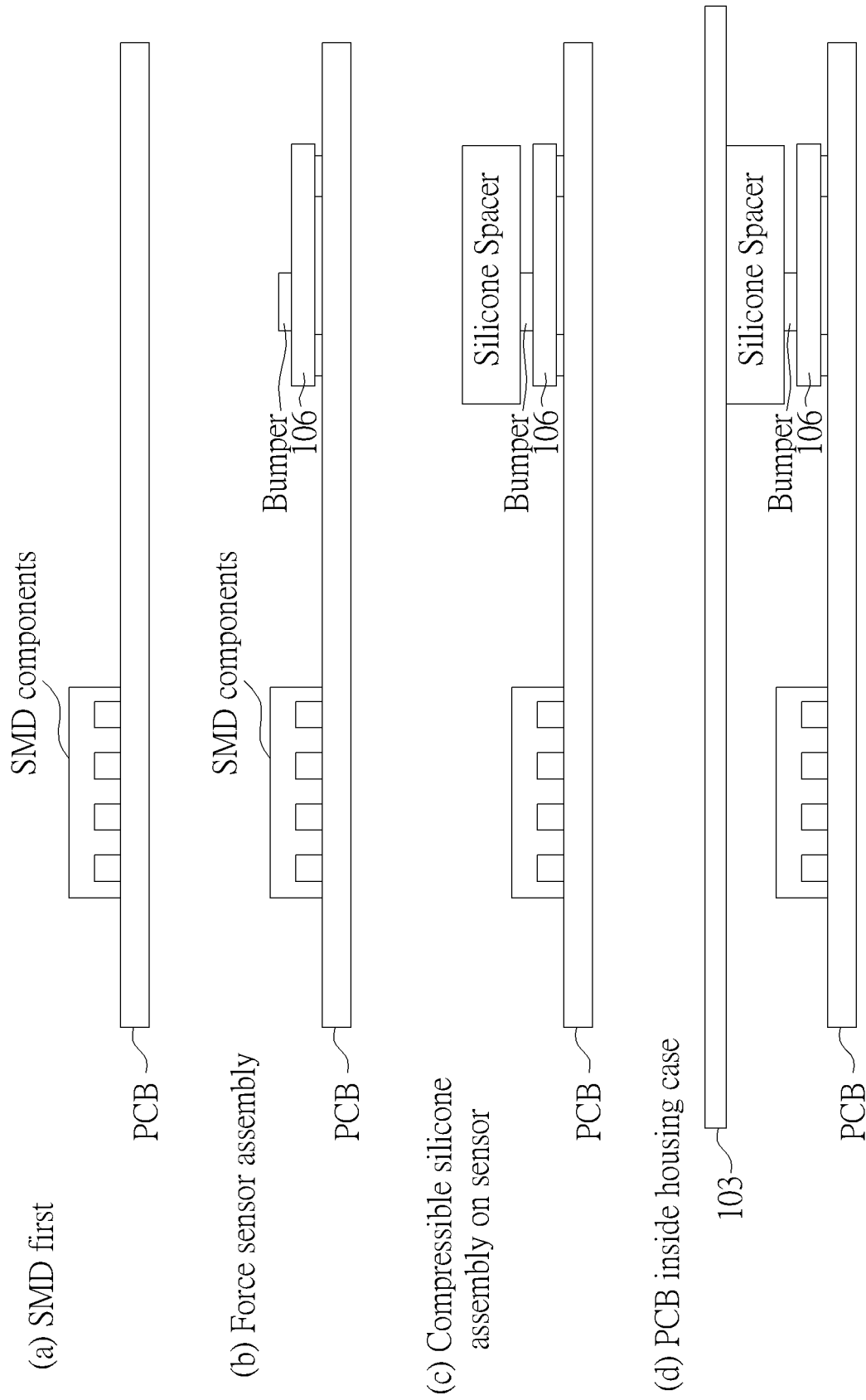
FIG. 13 is a diagram of an assembly procedure of earphone device according to another embodiment of the invention.

FIG. 13 is a diagram of an assembly procedure of earphone device 100 according to another embodiment of the invention. As shown in FIG. 13, for example (but not limited), circuit device(s) such as SMD component(s) may be disposed and installed onto the PCB in the step (a). Then, in the step (b), the force sensor patch 106 can be assembled and pasted onto the PCB. Then, in the step (c), a silicone spacer unit may be putted on the top of the bumper of the force sensor patch 106. Then, in the step (d), the housing subassembly 103 can be packaged to cover the PCB.

It should be noted that in FIG. 12 and FIG. 13 the silicone spacer unit may be compressed/compressible by the user during the assembly procedure to preload a particular pressure onto the force sensor patch 106 so as to make the force sensor patch 106 be able to precisely detect the user's force pressure upon the housing subassembly 103 after the assembly procedure has been completed. The shape of the silicone spacer unit may become smaller after the assembly procedure is completed. The force sensor patch 106 is arranged to detect the sudden change of pressure applied by the user, and thus the preloaded particular pressure will not affect the performance of force sensor patch 106.

Additionally, the above-mentioned force sensor patch may be implemented by using other circuit such as a force-sensitive resistor component different from the capacitor type force sensor. This also falls within the scope of the invention. Further, the electronic device 100 may be other different type electronic devices in response to different applications. Further, an advantage is that the top electrically conductive layer portion TOPCL can further provide the shielding effect.

Figure 14:
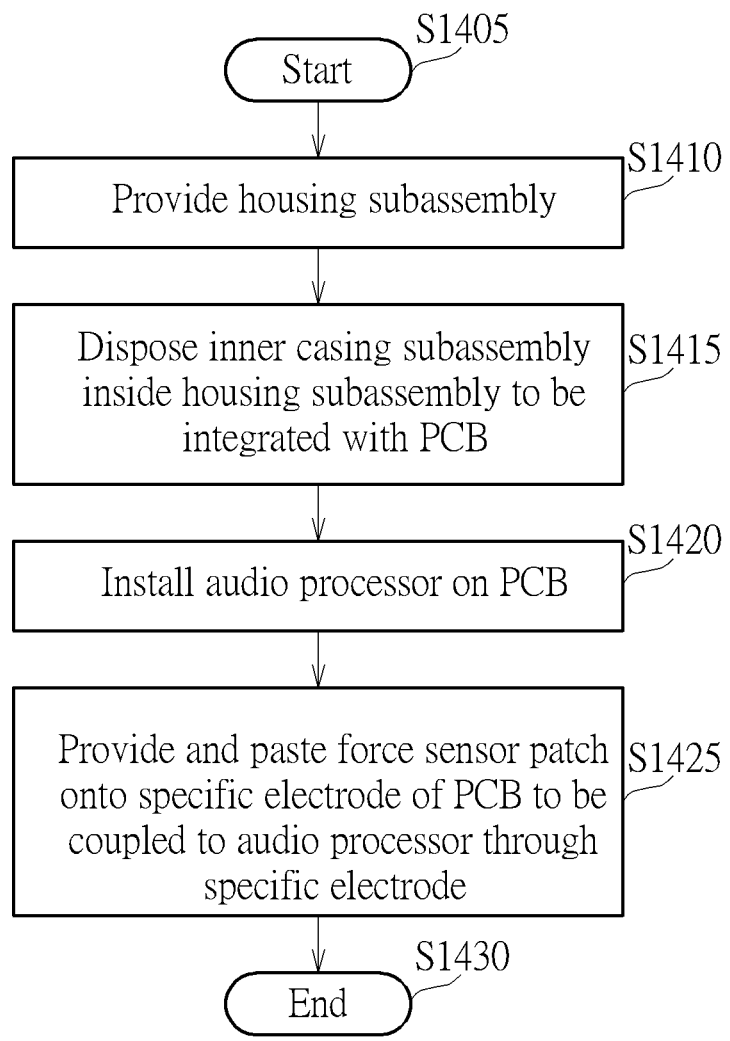
FIG. 14 is a schematic flowchart diagram of an assembly method procedure of a force sensor patch according to embodiments of the invention.

To make readers more clearly understand the operations of the invention, FIG. 14 is provided. FIG. 14 is a schematic flowchart diagram of an assembly method procedure of a force sensor patch according to embodiments of the invention. Provided that substantially the same result is achieved, the steps of the flowchart shown in FIG. 14 need not be in the exact order shown and need not be contiguous, that is, other steps can be intermediate. Steps are detailed in the following:

Step S1405: Start;
Step S1410: Provide a housing subassembly;
Step S1415: Provide and dispose an inner casing subassembly inside the housing subassembly to be integrated with a printed circuit board having at least one specific electrode;
Step S1420: Provide and install an audio processor on the printed circuit board;
Step S1425: Provide and paste a force sensor patch onto the at least one specific electrode of the printed circuit board to be coupled to the audio processor through the at least one specific electrode, so that the force sensor patch can be disposed between a part of the housing subassembly and a part of the inner casing subassembly and arranged to detect a user's pressure applied onto the part of the housing subassembly; and
Step S1430: End.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An earphone device, comprising:
a housing subassembly;
an inner casing subassembly, disposed in the housing subassembly and integrated with a printed circuit board having at least one specific electrode;
an audio processor, disposed on the printed circuit board; and
a force sensor patch, pasted onto the at least one specific electrode of the printed circuit board to be coupled to the audio processor through the at least one specific electrode;
wherein the force sensor patch is disposed between a part of the housing subassembly and a part of the inner casing subassembly and arranged to detect a user's pressure applied onto the part of the housing subassembly;
and, the force sensor patch comprises:
a top electrically conductive layer portion at a top surface;
an intermediate dielectric layer portion;
a compressible conductive portion, coupled to a bottom of the top electrically conductive layer portion; and
a bottom electrically conductive layer portion, coupled to a bottom of the intermediate dielectric layer portion;
wherein the compressible conductive portion is adhered to a second electrode of the printed circuit board, and the bottom electrically conductive layer portion is adhered to a first electrode of the printed circuit board.

2. The earphone device of claim 1, wherein the first electrode of the printed circuit board is a sensing electrode, and the second electrode of the printed circuit board is a ground electrode.

3. The earphone device of claim 1, further comprising:
a compressible spacer, disposed between the top electrically conductive layer portion and the part of the housing subassembly, to preload a pressure.

4. An earphone device, comprising:
a housing subassembly;
an inner casing subassembly, disposed in the housing subassembly and integrated with a printed circuit board having at least one specific electrode;
an audio processor, disposed on the printed circuit board;
a force sensor patch, pasted onto the at least one specific electrode of the printed circuit board to be coupled to the audio processor through the at least one specific electrode; and
a battery device, integrated with the inner casing subassembly;
wherein the force sensor patch is disposed between a part of the housing subassembly and a part of the inner casing subassembly and arranged to detect a user's pressure applied onto the part of the housing subassembly;
and, the force sensor patch is further adhered to a portion of a surface of the battery device and arranged as a gravity sensing circuit to detect sudden acceleration or deceleration of the battery device to sense sudden acceleration or deceleration of the earphone device.

5. A method for assembling an earphone device, comprising:
providing a housing subassembly;
providing and disposing an inner casing subassembly inside the housing subassembly to be integrated with a printed circuit board having at least one specific electrode;
providing and installing an audio processor on the printed circuit board;
providing and pasting a force sensor patch onto the at least one specific electrode of the printed circuit board to be coupled to the audio processor through the at least one specific electrode;
providing a battery device integrated with the inner casing subassembly;
adhering the force sensor patch to a portion of a surface of the battery device; and
using the force sensor patch as a gravity sensing circuit to detect sudden acceleration or deceleration of the battery device to sense sudden acceleration or deceleration of the earphone device;
wherein the force sensor patch is disposed between a part of the housing subassembly and a part of the inner casing subassembly and arranged to detect a user's pressure applied onto the part of the housing subassembly.

* * * * *